US012757666B2

(12) United States Patent
Bassett et al.

(10) Patent No.: US 12,757,666 B2
(45) Date of Patent: Oct. 6, 2026

(54) MITIGATION OF CAPILLARY PATTERN COLLAPSE IN SUPERCRITICAL DRY

(71) Applicant: Tokyo Electron Limited, Tokyo (JP)

(72) Inventors: Derek Bassett, Austin, TX (US); Rencheng Dong, Austin, TX (US); Amir Taghavi Nasrabadi, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 75 days.

(21) Appl. No.: 19/039,448

(22) Filed: Jan. 28, 2025

(65) Prior Publication Data

US 2026/0223620 A1 Jul. 30, 2026

(51) Int. Cl.
*H10P 70/00* (2026.01)
*H10P 72/00* (2026.01)

(52) U.S. Cl.
CPC .......... *H10P 70/80* (2026.01); *H10P 72/0408* (2026.01); *H10P 72/0602* (2026.01)

(58) Field of Classification Search
CPC ... H10P 70/80; H10P 72/0602; H10P 72/0408
See application file for complete search history.

(56) References Cited

U.S. PATENT DOCUMENTS

| | | | | |
|---|---|---|---|---|
| 2008/0000505 | A1* | 1/2008 | McDermott | B08B 3/12 134/105 |
| 2016/0289455 | A1* | 10/2016 | Inaoka | B08B 3/10 |
| 2021/0287919 | A1* | 9/2021 | Hurd | H10P 70/20 |
| 2023/0408194 | A1* | 12/2023 | Choi | F26B 5/005 |
| 2026/0107726 | A1* | 4/2026 | D'Elia | H10P 70/18 |

* cited by examiner

*Primary Examiner* — Sharidan Carrillo
(74) *Attorney, Agent, or Firm* — Oblon, McClelland, Maier & Neustadt, L.L.P.

(57) ABSTRACT

A method of wafer processing includes loading a wafer into a processing chamber. The wafer has a top surface coated with a solvent film including a first solvent and a second solvent. Relative to a total mass of the solvent film, the first solvent is 50 wt. % or more and less than 100 wt. %, and the second solvent is more than 0 wt. % and 50 wt. % or less. The second solvent has a higher vapor pressure and a lower surface tension than the first solvent. A processing fluid is supplied into the processing chamber so that the processing fluid in the processing chamber is a supercritical fluid in which the first solvent and the second solvent dissolve to form a supercritical mixture, which removes the first solvent and the second solvent from the top surface of the wafer. The supercritical mixture is discharged from the processing chamber.

20 Claims, 6 Drawing Sheets

MITIGATION OF CAPILLARY PATTERN COLLAPSE IN SUPERCRITICAL DRY

FIELD OF THE INVENTION

This disclosure relates to semiconductor processing and methods of microfabrication.

BACKGROUND

In the manufacture of a semiconductor device (especially on the microscopic scale), various fabrication processes are executed such as film-forming depositions, etch mask creation, patterning, material etching and removal, doping treatments, etc. These processes are performed repeatedly to form desired semiconductor device elements on a substrate. Critical to all these processes is wafer cleaning and drying as a clean and dry wafer is the prerequisite of virtually all semiconductor processing.

SUMMARY

The present disclosure relates to a method of wafer processing.

According to aspects of the present disclosure, a method of wafer processing is provided. The method includes loading a wafer into a processing chamber. The wafer has a top surface coated with a solvent film. The solvent film includes a first solvent and a second solvent. The first solvent has a concentration of 50 wt. % or more and less than 100 wt. % relative to a total mass of the solvent film. The second solvent has a concentration of more than 0 wt. % and 50 wt. % or less relative to the total mass of the solvent film. The second solvent has a higher vapor pressure and a lower surface tension than the first solvent. A processing fluid is supplied into the processing chamber so that the processing fluid is a supercritical fluid in the processing chamber and the first solvent and the second solvent dissolve in the supercritical fluid to form a supercritical mixture, which removes the first solvent and the second solvent from the top surface of the wafer. The supercritical mixture is discharged from the processing chamber.

In some embodiments, the first solvent includes a non-fluorinated organic solvent having 1 to 6 carbon atoms, at least one oxygen atom and no fluorine atom. The second solvent includes a fluorinated organic solvent having 3 to 16 carbon atoms, at least one fluorine atom and at least one oxygen or nitrogen atom.

In some embodiments, the first solvent has 1 to 6 carbon atoms, 1 to 2 oxygen atoms and no fluorine atom and includes at least one selected from the group consisting of an alcohol and a ketone. The second solvent has 3 to 10 carbon atoms, 6 to 22 fluorine atoms and 1 oxygen atom and includes at least one selected from the group consisting of an alcohol and an ether.

In some embodiments, the first solvent includes at least one selected from the group consisting of methanol, ethanol, 1-propanol, isopropyl alcohol, t-butyl alcohol, acetone and ethyl methyl ketone. The second solvent includes at least one selected from the group consisting of 3-methoxyperfluoro(2-methylpentane), 1,1,1,2,2,3,4,5,5,5-decafluoro-3-methoxy-4-(trifluoromethyl)-pentane, 1H,1H-perfluoro-1-heptanol, 3,3,4,4,4-pentafluoro-2-pentafluoroethyl-2-trifluoromethylbutanol, 1,1,2,3,3,3-hexafluoropropyl 1H,1H-heptafluorobutyl ether, 1,1,1,3,3,3-hexafluoro-2-propanol, 1H,1H,2H,2H-perfluorohexan-1-ol, 1-ethoxy-1,1,2,2,3,3,4,4,4-nonafluorobutane, 2-(ethoxydifluoromethyl)-1,1,1,2,3,3,3-heptafluoro propane and 3-(nonafluoro-tert-butyl) propan-1-ol.

In some embodiments, the first solvent includes isopropyl alcohol. The second solvent includes 3-methoxyperfluoro (2-methylpentane).

In some embodiments, the supplying and the discharging include introducing the processing fluid into the processing chamber until an inner pressure of the processing chamber reaches a first pressure so that a portion of the first solvent and a portion of the second solvent dissolve in the supercritical fluid to form the supercritical mixture, which reduces a mass of the solvent film on the top surface of the wafer. The inner pressure is reduced from the first pressure to a second pressure to remove a portion of the supercritical mixture from the processing chamber.

In some embodiments, the supplying and the discharging further include alternately repeating the introducing and the reducing.

In some embodiments, the first pressure is above a supercritical pressure of the processing fluid. The second pressure is at or above the supercritical pressure of the processing fluid.

In some embodiments, the supplying and the discharging include introducing the processing fluid into the processing chamber at a constant flow rate to form the supercritical mixture and discharging the supercritical mixture out of the processing chamber at the constant flow rate while the processing fluid is introduced into the processing chamber.

In some embodiments, prior to the loading, the method further includes dispensing a solvent mixture including the first solvent and the second solvent onto the top surface of the wafer.

In some embodiments, the wafer is rotated when the solvent mixture is initially dispensed onto the top surface of the wafer.

In some embodiments, the rotating is terminated, and then the dispensing is terminated to form the solvent film.

In some embodiments, prior to the dispensing, the method further includes executing at least one process selected from the group consisting of film deposition, etching, photoresist development, baking and doping.

In some embodiments, an inner temperature of the processing chamber is from Tc to Tc+20° C., and Tc is a supercritical temperature of the processing fluid.

In some embodiments, the processing fluid includes carbon dioxide.

In some embodiments, the first solvent has a concentration of 80 wt. % or more and 99 wt. % or less relative to the total mass of the solvent film. The second solvent has a concentration of 1 wt. % or more and 20 wt. % or less relative to the total mass of the solvent film.

In some embodiments, the first solvent and the second solvent have a total concentration of 90 wt. % or more and 100 wt. % or less relative to the total mass of the solvent film.

In some embodiments, prior to the loading, the method further includes dispensing a mixture of the first solvent and the second solvent onto the wafer to form the solvent film in a prior chamber and transporting the wafer from the prior chamber via a transportation chamber to the processing chamber.

In some embodiments, a vapor of the first solvent is supplied into the transportation chamber during the transporting.

In some embodiments, the prior chamber, the transportation chamber and the processing chamber are integrated on a common platform so that the solvent film is not exposed to an environment outside the common platform.

In some embodiments, the prior chamber includes a spin coater.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
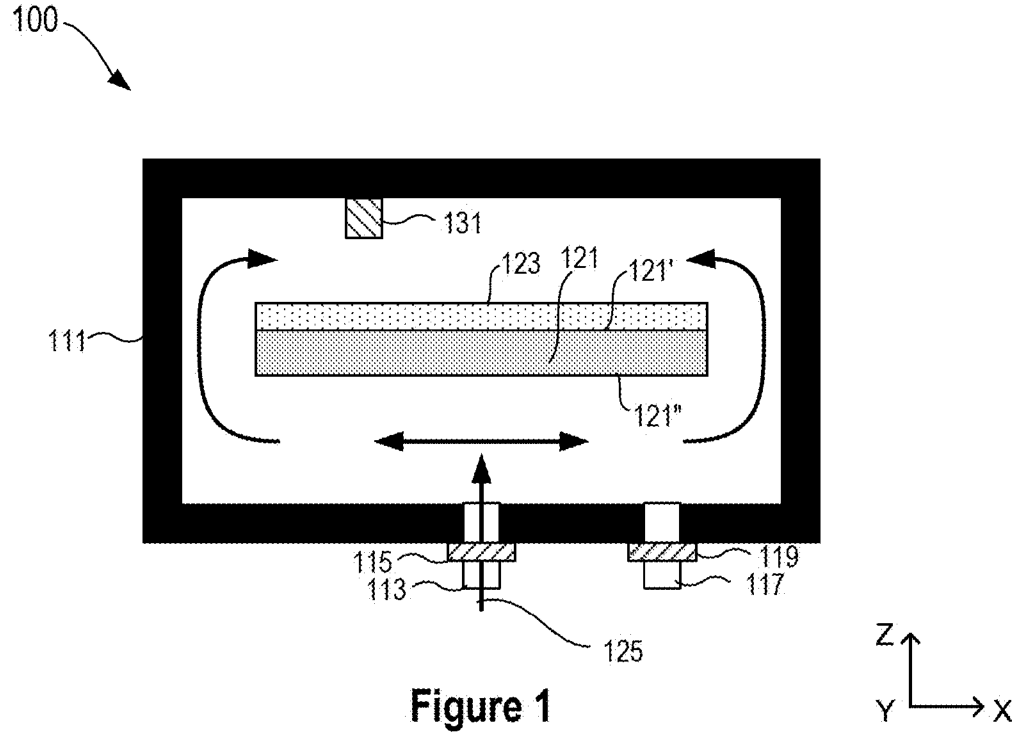
FIG. 1 shows a schematic of a processing chamber, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

In the drawings, like reference numerals designate identical or corresponding parts throughout the several views. Additionally, as used herein, the words "a", "an" and the like generally carry a meaning of "one or more", unless stated otherwise.

Furthermore, the terms, "approximately", "approximate", "about" and similar terms generally refer to ranges that include the identified value within a margin of 20%, 10%, or preferably 5%, and any values therebetween.

A numerical range represented by "to", "from . . . to . . . ", "-" and similar terms includes numerical values at both ends, unless specified otherwise.

As noted in the Background, wafer cleaning and drying are important. A wafer is often cleaned in order to remove liquid and solid contaminants from its surface. A wet cleaning process typically utilizes one or more cleaning fluids such as an aqueous cleaning solution, an organic cleaning solution, water, an organic solvent, etc. Having a relatively small surface tension and a relatively high volatility, isopropanol alcohol (IPA) is often used as the last cleaning fluid in a wet cleaning process. After the wet cleaning process, it is often necessary to remove the residual cleaning liquid(s) from the wafer surface by a drying fluid such as nitrogen.

Figure 3A:
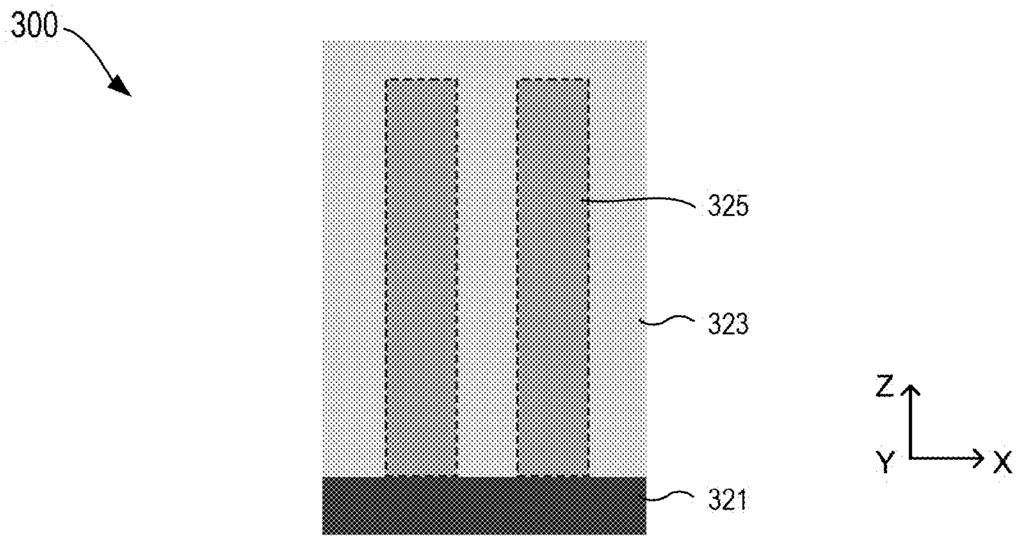
FIGS. 3A and 3B respectively show vertical cross-sectional views of a semiconductor device before and after pattern collapse, in accordance with some embodiments of the present disclosure.
Figure 3B:
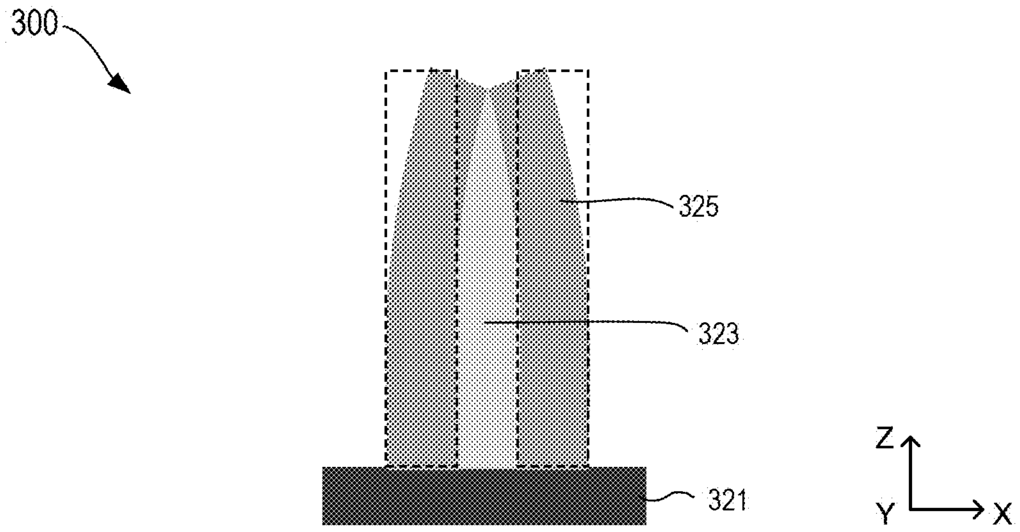

However as device miniaturization continues, conventional cleaning and drying techniques lead to pattern collapse for nanoscopic patterns, especially with high aspect ratio features. FIG. 3A shows a cross-sectional view of a wafer 300 before pattern collapse, and FIG. 3B shows a cross-sectional view of the wafer 300 after pattern collapse. A line pattern 325 on a wafer 321 is immersed in a cleaning solvent 323 such as isopropanol alcohol. As the cleaning solvent 323 evaporates and/or is removed from the wafer 321 by other means such as by blowing nitrogen towards the wafer 321 and/or rotating the wafer 321, the capillary forces of the cleaning solvent 323 can cause material deformation to bend the line pattern 325 as well as leave residues of the cleaning solvent 323 on the wafer 321.

A supercritical drying process is considered to hold promise as an alternative to the existing drying process for addressing the pattern collapse problem. An important purpose of the supercritical drying process is to eliminate capillary pattern collapse. It accomplishes this by moving above the critical point where there are no separate liquid and vapor phases. For example, some systems use supercritical carbon dioxide in a chamber with liquid IPA on the wafer surface. However, capillary pattern collapse for certain structures is still observed by the industry. That is to say, the supercritical drying process is still seeing defects due to capillary pattern collapse, which it is designed to prevent.

Figure 4A:
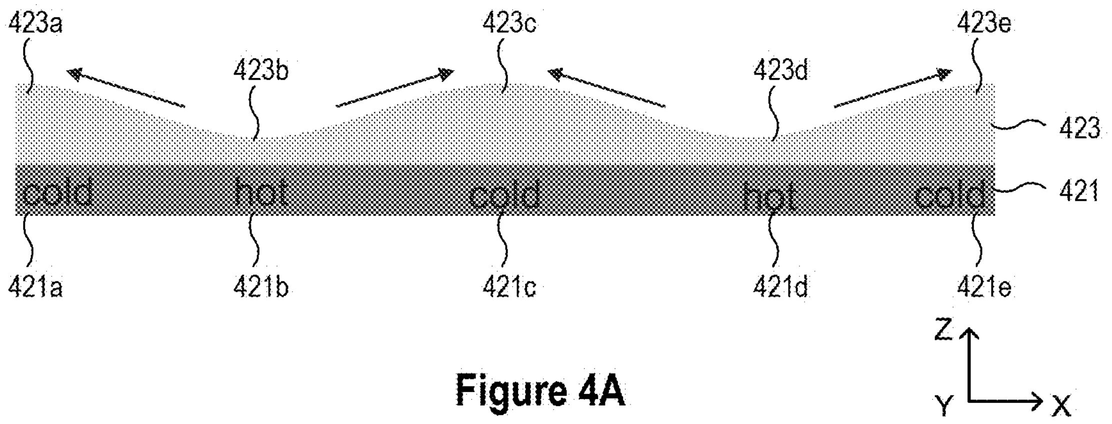
FIG. 4A shows a schematic of Marangoni flow, in accordance with some embodiments of the present disclosure.
Figure 4B:
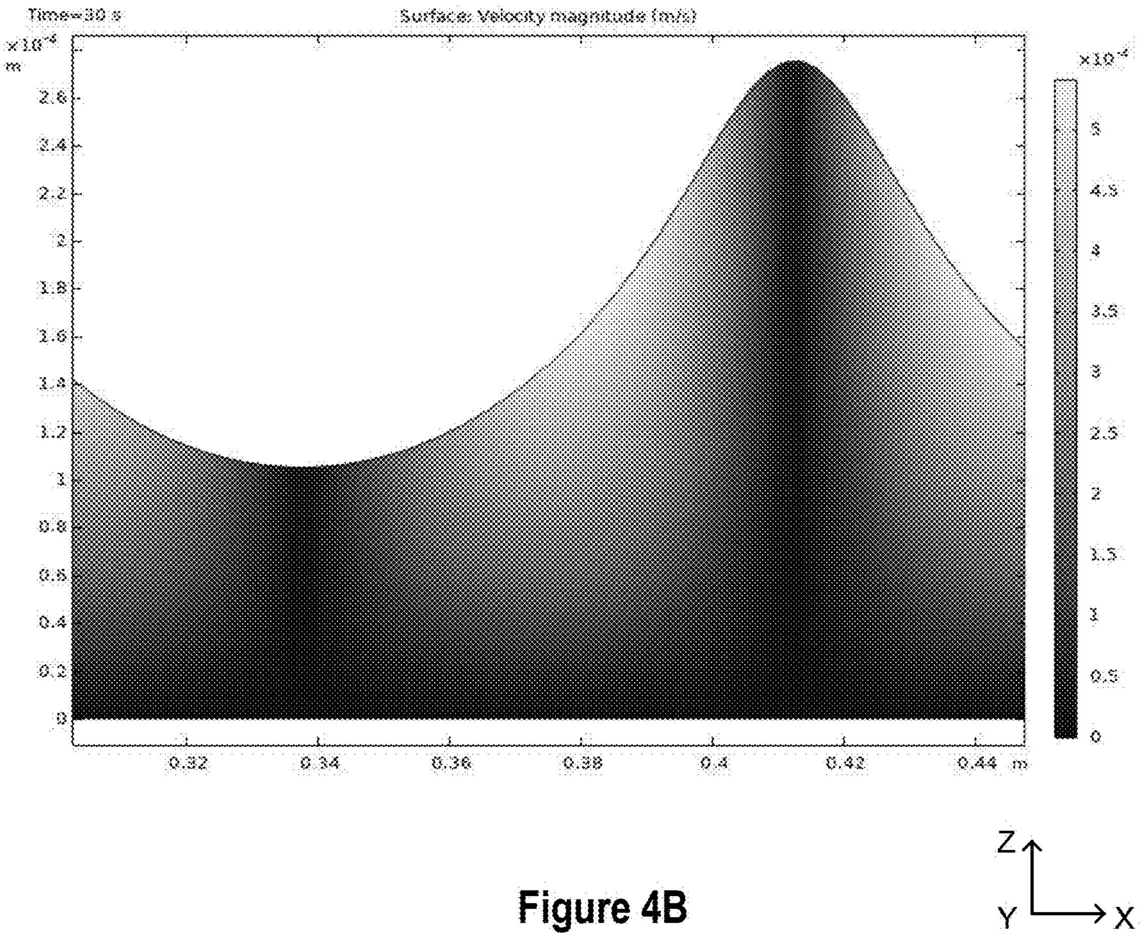
FIG. 4B shows simulation results of Marangoni flow, in accordance with some embodiments of the present disclosure.

As shown in FIGS. 4A and 4B, experimental data and simulations by the inventor of the present disclosure point to Marangoni flow caused by temperature non-uniformity as a cause in a supercritical drying process. Marangoni flow is a phenomenon caused by a local difference in surface tension across a liquid surface. Typical causes of Marangoni flow include local changes in concentration (e.g. Marangoni dry) and local changes in temperature.

In FIG. 4A, a wafer 421 is coated with a solvent film 423 including one or more organic solvents. In this example, the solvent film 423 includes isopropanol alcohol (IPA). The wafer 421 can have relatively cold regions 421*a*, 421*c* and 421*e* and relatively hot regions 421*b* and 421*d* due to temperature non-uniformity across the wafer 421. Accordingly, the solvent film 423 can have thicker regions 423*a*, 423*c* and 423*e* and thinner regions 423*b* and 423*d*, for example due to faster solvent evaporation at higher temperatures. Surface tension decreases with increasing temperature. This causes higher surface tension in cold areas (e.g. 421*a*, 421*c* and 421*e*) to pull liquid away from hot areas (e.g. 421*b* and 421*d*) as illustrated by arrows in FIG. 4A. This flow can cause the solvent film 423 to become too thin at hotspots (e.g. 421*a*, 421*c* and 421*e*), creating dry spots that can cause pattern collapse.

FIG. 4B shows simulation results of a solvent film on a wafer at 30 seconds, which supports the inventor's hypothesis that temperature non-uniformity on wafer causes Marangoni flow which in turn causes capillary pattern collapse. The horizontal axis represents a distance from a wafer center. The left vertical axis represents a film thickness in $\times10^{-4}$ m (or arbitrary units). The right vertical axis represents velocity in m/s (or arbitrary units). As illustrated, Marangoni flow on the wafer is significant and quick enough to occur in less than one minute. There is enough flow for the film height to decrease significantly. For instance, an average film thickness is about $1.7\times10^{-4}$ m while a difference between a thickest point and a thinnest point is about $1.0\times10^{-4}$ m, which is about 59% of the average film thickness. Therefore, computational fluid dynamics (CFD) simulation of Marangoni flow confirms a significant change in film height within 30 seconds.

Techniques herein provide a solution to mitigate pattern collapse by suppressing or reducing the Marangoni effect. Because the Marangoni flow can be caused by temperature non-uniformity, one possible solution is to make the temperature more uniform inside the supercritical drying chamber for example by locally measuring and controlling the temperature on a wafer. Alternatively or additionally, it is desirable to find a way to prevent Marangoni flow from occurring even though there is a significant temperature non-uniformity.

According to aspects of the present disclosure, an intelligently chosen additive chemical to the cleaning solvent e.g. isopropanol alcohol (IPA) on the wafer can prevent or reduce Marangoni flow. That is, the liquid on the wafer can be changed to a solution that is formulated to reduce Marangoni flow. For example, additional chemistry is added to the IPA on the wafer during the supercritical drying process to reduce/prevent Marangoni flow and subsequent pattern collapse.

Techniques herein leverage a co-solvent or a solvent additive, in addition to an organic solvent such as IPA. As a result, a wafer surface is coated with a liquid film of the organic solvent and the co-solvent. Then a supercritical fluid such as carbon dioxide can be utilized to remove the organic solvent and the co-solvent from the wafer surface by dissolving the organic solvent and the co-solvent. Particularly, the co-solvent is designed to have a higher vapor pressure and a lower surface tension than the organic solvent in order to reduce or suppress Marangoni flow, as will be explained in FIGS. 5A, 5B and 5C.

Figure 5A:
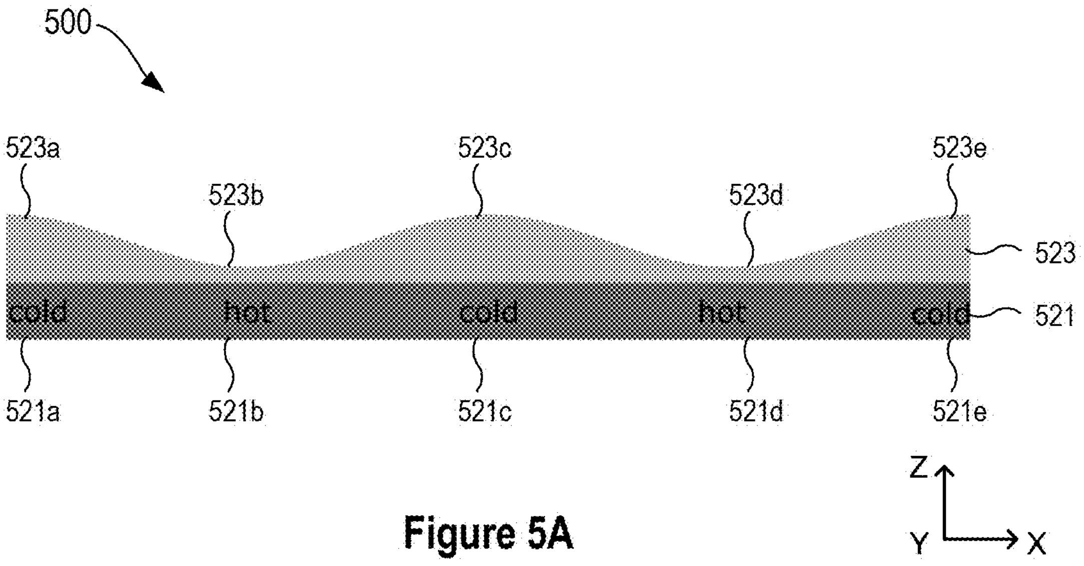
FIGS. 5A, 5B and 5C show schematics of Marangoni flow development and mitigation, in accordance with some embodiments of the present disclosure.

As shown in FIG. 5A, a wafer 521 is coated with a solvent film 523. In this example, the solvent film 523 includes a first solvent of isopropanol alcohol (IPA) and a second solvent of 3-methoxyperfluoro (2-methylpentane) (also referred to as a co-solvent). A temperature gradient or temperature non-uniformity can start Marangoni flow, even when a coating liquid or film is at a uniform concentration. As a result, the wafer 521 can have relatively cold regions 521*a*, 521*c* and 521*e* and relatively hot regions 521*b* and 521*d*. Accordingly, the solvent film 523 can have thicker regions 523*a*, 523*c* and 523*e* and thinner regions 523*b* and 523*d*. As explained in FIG. 4A, surface tension decreases with increasing temperature, which may cause higher surface tension in the relatively cold regions 521*a*, 521*c* and 521*e* to pull liquid away from the relatively hot regions 521*b* and 521*d*.

Figure 5B:
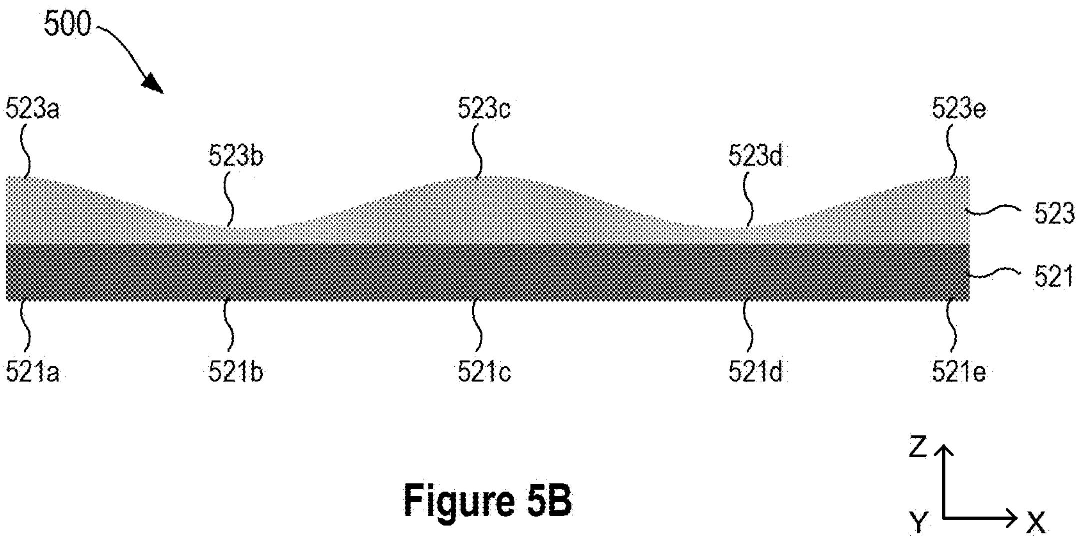

In FIG. 5B, the thicker regions 523*a*, 523*c* and 523*e* are drawn to be darker to denote a relatively low IPA concentration and a relatively high co-solvent concentration whereas the thinner regions 523*b* and 523*d* are drawn to be lighter to denote a relatively high IPA concentration and a relatively low co-solvent concentration. That is, the co-solvent of 3-methoxyperfluoro (2-methylpentane) has a higher vapor pressure than IPA. Consequently, the co-solvent evaporates faster than IPA, especially in the relatively hot regions 521*b* and 521*d*. As a result, the co-solvent has a higher concentration in the thicker regions 523*a*, 523*c* and 523*e* than in the thinner regions 523*b* and 523*d*. IPA has a higher concentration in the thinner regions 523*b* and 523*d* than in the thicker regions 523*a*, 523*c* and 523*e*. In other words, areas with higher temperature have a higher evaporation rate of the co-solvent, resulting in a higher IPA concentration in hot areas.

Moreover, as the co-solvent of 3-methoxyperfluoro (2-methylpentane) has a lower surface tension than IPA, the co-solvent can suppress the thicker regions 523*a*, 523*c* and 523*e* from pulling liquid from the thinner regions 523*b* and 523*d*, in direct contrast to the liquid pull denoted by arrows in FIG. 4A. In other words, surface tension in hot areas increases as a result of the co-solvent in FIG. 5B, thus counteracting and reducing Marangoni effect. Therefore, Marangoni flow is suppressed or reduced in FIG. 5C. Film thickness difference between the thicker regions 523*a*, 523*c* and 523*e* and the thinner regions 523*b* and 523*d* is thus reduced. The solvent film 523 is overall smoother and flatter in FIG. 5C than in FIG. 5B.

Figure 5C:
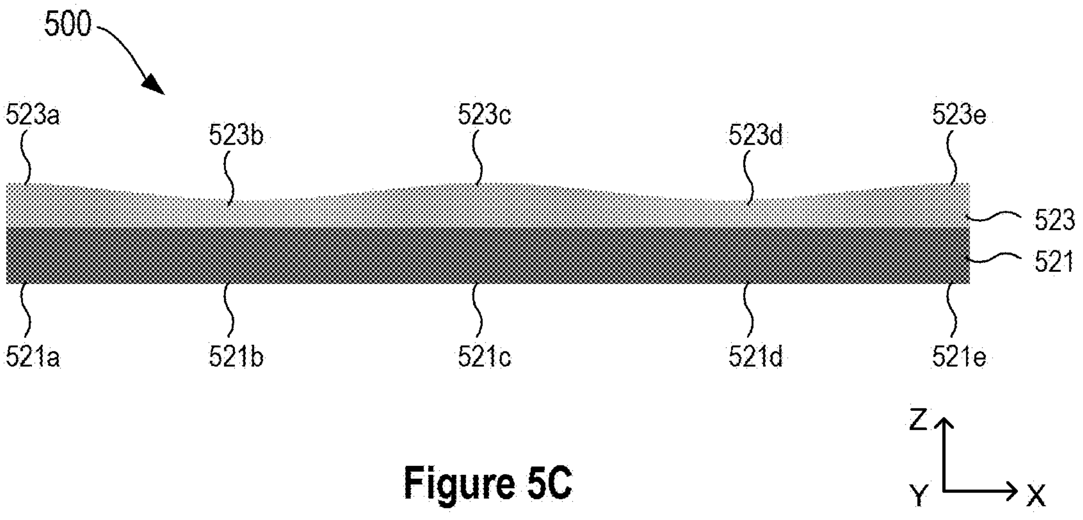

While IPA and 3-methoxyperfluoro (2-methylpentane) are respectively used as the first solvent and the second solvent in FIGS. 5A-5C for illustrative purposes, it should be understood that other solvents can be used alternatively or additionally.

In some embodiments, the first solvent includes a non-fluorinated organic solvent having 1 to 6 carbon atoms, at least one oxygen atom and no fluorine atom. Preferably, the first solvent has 1 to 6 carbon atoms, 1 to 2 oxygen atoms and no fluorine atom and includes an alcohol, a ketone or both. Preferably, the first solvent includes methanol, ethanol, 1-propanol, isopropyl alcohol (IPA), t-butyl alcohol, acetone, ethyl methyl ketone, or any combinations thereof. Preferably, the first solvent includes IPA.

Figure 6:
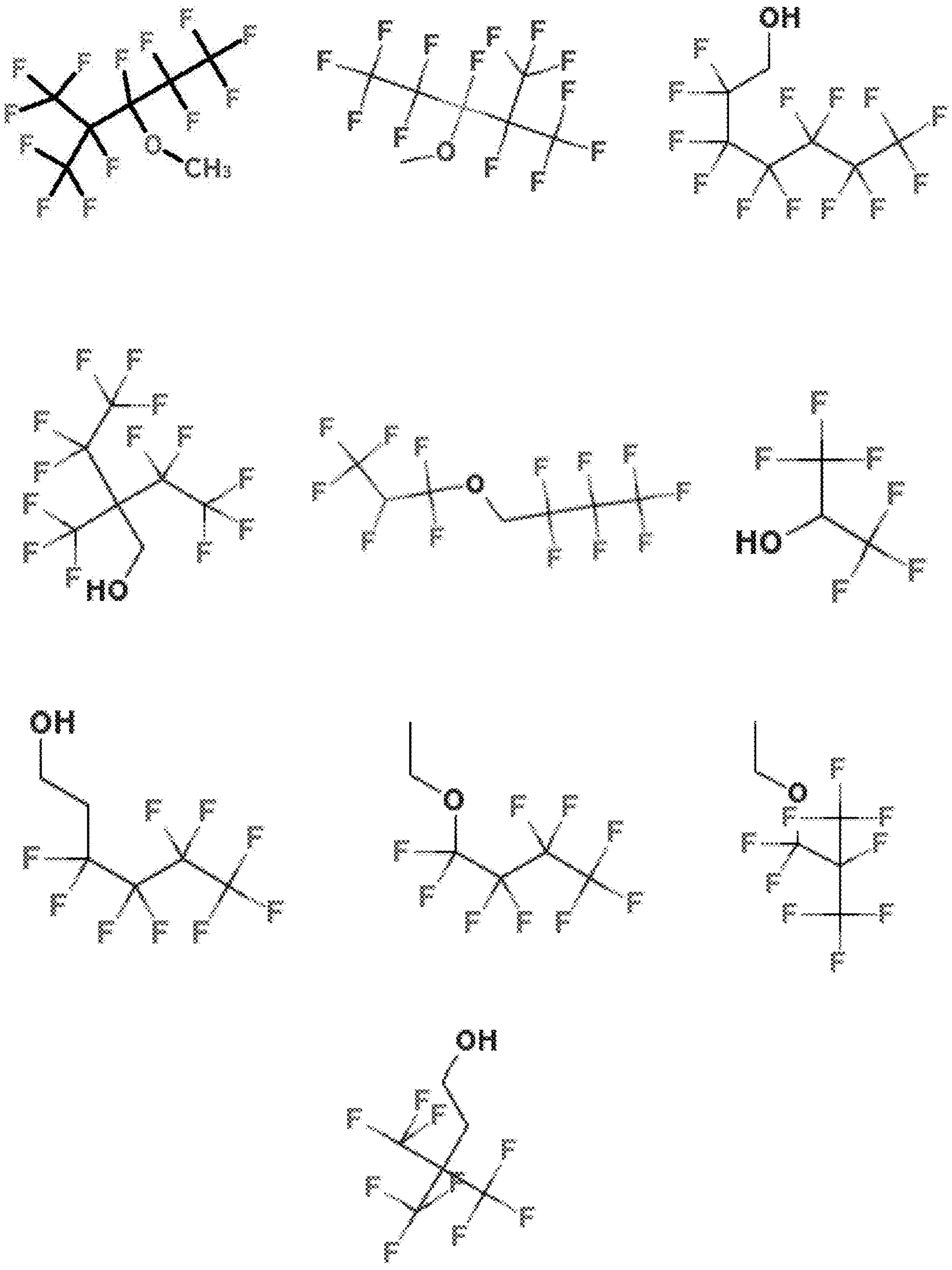
FIG. 6 shows solvent additive examples, in accordance with some embodiments of the present disclosure.

In some embodiments, the second solvent includes a fluorinated organic solvent having 3 to 16 carbon atoms, at least one fluorine atom and at least one oxygen or nitrogen atom. As discussed earlier, the second solvent is designed to have a higher vapor pressure and a lower surface tension than the first solvent. Having at least one fluorine atom can impart a relatively low surface tension to the second solvent. Having at least one oxygen or nitrogen atom can improve miscibility of the second solvent with the first solvent. For instance, the second solvent can include a partially to fully perfluoric (or perfluoro) alcohol and/or ether. Preferably, the second solvent has 3 to 10 carbon atoms (e.g. 3, 4, 5, 6, 7, 8, 9 or 10 carbon atoms), 6 to 22 fluorine atoms (e.g. 6, 7, 8, 9, 10, 12, 15, 18, 20 or 22 fluorine atoms) and 1 oxygen atom. Preferably, the second solvent includes 3-methoxyperfluoro (2-methylpentane), 1,1,1,2,2,3,4,5,5,5-decafluoro-3-methoxy-4-(trifluoromethyl)-pentane, 1H,1H-perfluoro-1-heptanol, 3,3,4,4,4-pentafluoro-2-pentafluoroethyl-2-trifluoromethylbutanol, 1,1,2,3,3,3-hexafluoropropyl 1H,1H-heptafluorobutyl ether, 1,1,1,3,3,3-hexafluoro-2-propanol, 1H,1H,2H,2H-perfluorohexan-1-ol, 1-ethoxy-1,1,2,2,3,3,4,4,4-nonafluorobutane, 2-(ethoxydifluoromethyl)-1,1,1,2,3,3,3-heptafluoro propane, 3-(nonafluoro-tert-butyl) propan-1-ol or any combinations thereof. FIG. 6 shows a non-exhaustive list of examples of the second solvent, in accordance with some embodiments of the present disclosure. Preferably, the second solvent includes 3-methoxyperfluoro (2-methylpentane).

Relative to a total mass of the solvent film 523, the first solvent can have a concentration of 1 wt. % or more and less than 100 wt. %, e.g. 1 wt. %, 5 wt. %, 10 wt. %, 20 wt. %, 30 wt. %, 40 wt. %, 50 wt. %, 60 wt. %, 70 wt. %, 80 wt. %, 90 wt. %, 95 wt. %, 98 wt. %, 99 wt. %, 99.9 wt. % or any values therebetween. Preferably, the first solvent has a concentration of 50-99 wt. %, preferably 75-97 wt. %, preferably 85-93 wt. %, relative to the total mass of the solvent film 523.

Relative to the total mass of the solvent film 523, the second solvent can have a concentration of 1 wt. % or more and less than 100 wt. %, e.g. 0.1 wt. %, 1 wt. %, 2 wt. %, 5 wt. %, 10 wt. %, 20 wt. %, 30 wt. %, 40 wt. %, 50 wt. %, 60 wt. %, 70 wt. %, 80 wt. %, 90 wt. %, 95 wt. %, 98 wt. %, 99 wt. % or any values therebetween. Preferably, the second solvent has a concentration of 1-50 wt. %, preferably 3-25 wt. %, preferably 7-15 wt. %, relative to the total mass of the solvent film 523.

As discussed earlier, the first solvent can include a non-fluorinated alcohol or ketone, which is usually more environmentally friendly and economically affordable than a fluorinated alcohol or ether included by the second solvent. Therefore, the first solvent preferably has a higher concentration than the second solvent in the solvent film 523. Accordingly, the first solvent can also be referred to as a majority solvent, a primary solvent or the like. The second solvent can also be referred to as a minority solvent, a secondary solvent, a co-solvent, a solvent additive or the like.

The first solvent and the second solvent can preferably form a single homogeneous phase in the solvent film 523. In other words, the first solvent and the second solvent are preferably soluble in each other or miscible with each other in the concentrations discussed above. In some embodiments, the first solvent and the second solvent are completely miscible with each other at any ratios or concentrations. In other embodiments, the first solvent and the second solvent have limited solubility in each other or limited miscibility with each other, provided that the first solvent and the second solvent form a single homogeneous phase in the solvent film 523 at a given ratio or given concentrations as discussed above.

Additionally, relative to the total mass of the solvent film 523, the first solvent and the second solvent can have a total concentration of 60 wt. % or more and 100 wt. % or less, e.g. 60 wt. %, 70 wt. %, 80 wt. %, 90 wt. %, 95 wt. %, 98 wt. %, 99 wt. %, 99.9 wt. %. 100 wt. % or any values therebetween. Preferably, the first solvent and the second solvent have a total concentration of 75-99 wt. %, preferably 85-97 wt. %, preferably 90-95 wt. %, relative to the total mass of the solvent film 523.

In some embodiments, relative to the total mass of the solvent film 523, the solvent film 523 may include impurities having a total concentration of 0 wt. % or more and 20 wt. % or less, e.g. 0.01 parts per million (ppm, where 1 ppm=$10^{-4}$ wt. %), 0.1 ppm, 1 ppm, 10 ppm, 100 ppm, 0.1 wt. %, 1 wt. %, 2 wt. %, 5 wt. %, 10 wt. %, 15 wt. % 20 wt. % or any values therebetween. The impurities can include, but are not limited to, water, an organic molecule such as an organic solvent other than the first solvent and the second solvent, a metal contaminant, a dielectric contaminant, particles such as dust particles, residues from a prior process such as a photoresist residue, or any combinations thereof. Preferably, the solvent film 523 includes 0 ppm or more and less than 1 ppm of a metal contaminant, 0 ppm or more and less than 100 ppm of an organic contaminant, and 0 ppm or more and less than 100 ppm of water. Preferably, the first solvent and the second solvent are semiconductor grade. In a non-limiting example, the solvent film 523 may include a third solvent other than the first solvent and the second solvent discussed above, at a concentration of 0-15 wt. %, preferably 1-12 wt. %, preferably 3-7 wt. %, relative to the total mass of the solvent film 523.

In a non-limiting example, the solvent film 523 includes or consists of 80-99 wt. % of IPA as the first solvent, 1-15 wt. % of 3-methoxyperfluoro(2-methylpentane) as the second solvent, and 0-5 wt. % of impurities relative to the total mass of the solvent film 523.

FIG. 1 shows a schematic of a processing chamber 100, in accordance with some embodiments of the present disclosure. The processing chamber 100 can include a housing 111 configured to receive a wafer 121 having a top surface 121' coated with a solvent film 123. The wafer 121 herein can correspond to the wafer 521 in FIGS. 5A-5C while the solvent film 123 herein can correspond to the solvent film 523 in FIGS. 5A-5C. Descriptions have been provided above and will be omitted herein for simplicity purposes. Particularly, the solvent film 123 can include the aforementioned first solvent and the aforementioned second solvent.

While omitted for simplicity purposes, it should be understood that the processing chamber 100 may include a wafer support structure to physically support and hold the wafer 121. For example, the wafer support structure can be positioned below the wafer 121 and partially or wholly cover a back surface 121" of the wafer 121.

The processing chamber 100 can also include an inlet 113 configured to receive a processing fluid 125 such as carbon dioxide. The processing fluid 125 may initially enter a lower part of the processing chamber 100 before moving to an upper part of the processing chamber 100, as demonstrated by arrows. An inlet valve 115 can be coupled with the inlet 113 to regulate a flow rate of the processing fluid 125. An outlet 117 can be configured to discharge a fluid out of the processing chamber 100. An outlet valve 119 can be coupled with the outlet 117 to regulate a discharge rate of the fluid. The numbers and the positions of the inlet 113, the inlet valve 115, the outlet 117 and the outlet valve 119 are not particularly limited. For instance, one or more additional inlets and outlets may be positioned on the lower part and/or the upper part of the processing chamber 100.

The processing chamber 100 can further include at least one sensor 131 in the housing 111. The at least one sensor 131 may include, but is not limited to, a pressure sensor, a temperature sensor, a concentration sensor or any combinations thereof. The concentration sensor can for example monitor the concentration(s) of the first solvent, the second solvent and/or the processing fluid 125. Preferably, the concentration sensor can monitor the concentration(s) of IPA, 3-methoxyperfluoro (2-methylpentane) and/or carbon dioxide for example using known techniques in the art. The number and the position of the at least one sensor 131 are not particularly limited. For instance, multiple pressure sensors, multiple temperature sensors and multiple concentration sensors can be positioned in various locations of the processing chamber 100, e.g. on an inner wall of the housing 111, on the back surface 121" of the wafer 121, above the top surface 121' of the wafer 121, on the wafer support structure, etc.

During operation, an inner pressure of the processing chamber 100 can be at or above a supercritical pressure Tp of the processing fluid 125. For example, the inner pressure can be from Tp to 3Tp, e.g. Tp, 1.05 Tp, 1.1Tp, 1.2Tp, 1.5Tp, 1.7Tp, 2Tp, 2.5Tp, 3Tp or any values therebetween. Preferably, the inner pressure is from 1.1Tp to 1.8Tp, more preferably from 1.3Tp to 1.6Tp. An inner temperature of the processing chamber 100 can be at or above a supercritical temperature Tc of the processing fluid 125. For example, the inner temperature can be from Tc to Tc+80° C. e.g. Tc, Tc+1° C., Tc+2° C., Tc+5° C., Tc+10° C., Tc+20° C., Tc+30° C., Tc+40° C., Tc+50° C., Tc+60° C., Tc+80° C. or any values therebetween. Preferably, the inner temperature is from Tc+5° C. to Tc+20° C., more preferably from Tc+10° C. to Tc+15° C.

As previously mentioned, the second solvent can have a higher vapor pressure and a lower surface tension than the first solvent under the experimental conditions of the present disclosure e.g. from atmospheric pressure to the inner pressure of the processing chamber 100 and from room temperature to the inner temperature of the processing chamber 100. For example, the second solvent can have a higher vapor pressure and a lower surface tension than the first solvent from 1 atm to 30 atm (e.g. 1 atm, 1.5 atm, 2 atm, 3 atm, 4 atm, 5 atm, 7.5 atm, 10 atm, 15 atm, 20 atm, 25 atm, 30 atm or any values therebetween) and from 20° C. to 200° C. (e.g. 20° C., 30° C., 40° C., 50° C., 60° C., 80° C., 100° C., 120° C., 140° C., 160° C., 180° C., 200° C. or any values therebetween). Preferably, the second solvent has a higher vapor pressure and a lower surface tension than the first solvent at the inner pressure and the inner temperature of the processing chamber 100.

In some embodiments, the wafer 121 coated with the solvent film 123 can be loaded into the processing chamber 100 at atmospheric pressure and room temperature (e.g. 20-25° C.) before the inner pressure and the inner temperature are adjusted to the values discussed above. In some embodiments, the inner pressure and the inner temperature are adjusted to the values discussed above, before the wafer 121 is loaded into the processing chamber 100. The processing chamber 100 can be filled with the processing fluid (e.g. carbon dioxide) before the wafer 121 is loaded. Alternatively or additionally, the processing chamber 100 can be flushed with the processing fluid after the wafer 121 is loaded. The specific operating order and operating parameters are not particularly limited and can be tailored depending on specific design needs.

In some embodiments, the processing fluid 125 is introduced into the processing chamber 100 via the inlet 113 such that the processing fluid 125 is a supercritical fluid in the processing chamber 100 at or above a critical point of the processing fluid 125. In one embodiment, the processing fluid 125 is not in a supercritical state before entering the processing chamber 100 and goes into the supercritical state after entering the processing chamber 100. For instance, carbon dioxide in a gas state below its supercritical point can be introduced into the processing chamber 100 and then goes into a supercritical state in the processing chamber 100. In another embodiment, the processing fluid 125 is in the supercritical state before, during and after entering the processing chamber 100.

In a non-limiting example, during an initial stage of a pressurization process, the processing chamber 100 is at a relatively low pressure so carbon dioxide, which is supercritical in a pipe before entering the processing chamber 100, will flash into vapor phase upon entering the processing chamber 100. As pressure increases, carbon dioxide, which is supercritical in the pipe before entering the processing chamber 100, will remain supercritical after entering the processing chamber 100.

As the processing fluid 125 is a supercritical fluid in the processing chamber 100, the first solvent and the second solvent can dissolve in or mix with the supercritical fluid to form a supercritical mixture. As a result, the first solvent and the second solvent can be removed from the top surface 121' of the wafer 121 by the supercritical fluid. The supercritical mixture can be discharged out of the processing chamber 100 via the outlet 117, with the inlet valve 115 closed and the outlet valve 119 open.

In a non-limiting example, the processing fluid 125 is introduced into the processing chamber 100 via the inlet 113 until the inner pressure of the processing chamber 100 reaches a first pressure so that a portion of the first solvent and a portion of the second solvent dissolve in the processing fluid 125 in the supercritical state (or rather the supercritical fluid) to form the supercritical mixture, which reduces a mass of the solvent film 123 on the top surface 121' of the wafer 121. The first pressure is above the supercritical pressure of the processing fluid 125. Subsequently, the inner pressure can be reduced from the first pressure to a second pressure to discharge a portion of the supercritical mixture out of the processing chamber 100 via the outlet 117. The second pressure is lower than the first pressure and is preferably at or above the supercritical pressure of the processing fluid 125. The cycle of introducing the processing fluid 125 to reach the first pressure and then reducing the inner pressure to the second pressure to discharge a portion of the supercritical mixture can be alternately repeated, for example until the solvent film 123 is removed from the top surface 121' of the wafer 121. This cycling process can be monitored by the aforementioned concentration sensor(s) and terminated for example when concentrations of the first solvent (e.g. IPA) and the second solvent (e.g. 3-methoxyperfluoro (2-methylpentane)) in the processing chamber 100 are both below predetermined threshold values. The inner temperature of the processing chamber 100 is kept at or above the supercritical temperature of the processing fluid 125 during the cycling process.

In another example, the solvent film 123 is removed from the top surface 121' of the wafer 121 and purged out of the processing chamber 100 via a constant-flow-in-and-constant-flow-out process. For instance, the processing fluid 125 can be introduced into the processing chamber 100 at a constant flow rate via the inlet 113 while an exhaust fluid (e.g. the supercritical mixture) is discharged out of the processing chamber 100 at the constant flow rate via the outlet 117. In other words, both the inlet 113 and the outlet 117 are open, and the processing chamber 100 can be maintained at a constant pressure that is at or above the supercritical pressure of the processing fluid 125. As discussed earlier, the numbers and the positions of the inlet 113 and the outlet 117 are not particularly limited.

While carbon dioxide is used as an example of the processing fluid 125 for illustrative purposes, it should be understood that other processing fluids can be used alternatively or additionally. In some embodiments, the processing fluid 125 includes, but is not limited to, carbon dioxide, methane, ethane, propane, ethylene, propylene, methanol, ethanol, acetone, nitrous oxide, water or any combinations thereof. Preferably, the processing fluid 125 includes carbon dioxide, methane, ethane and/or acetone. Preferably, the processing fluid 125 includes carbon dioxide.

Figure 2:
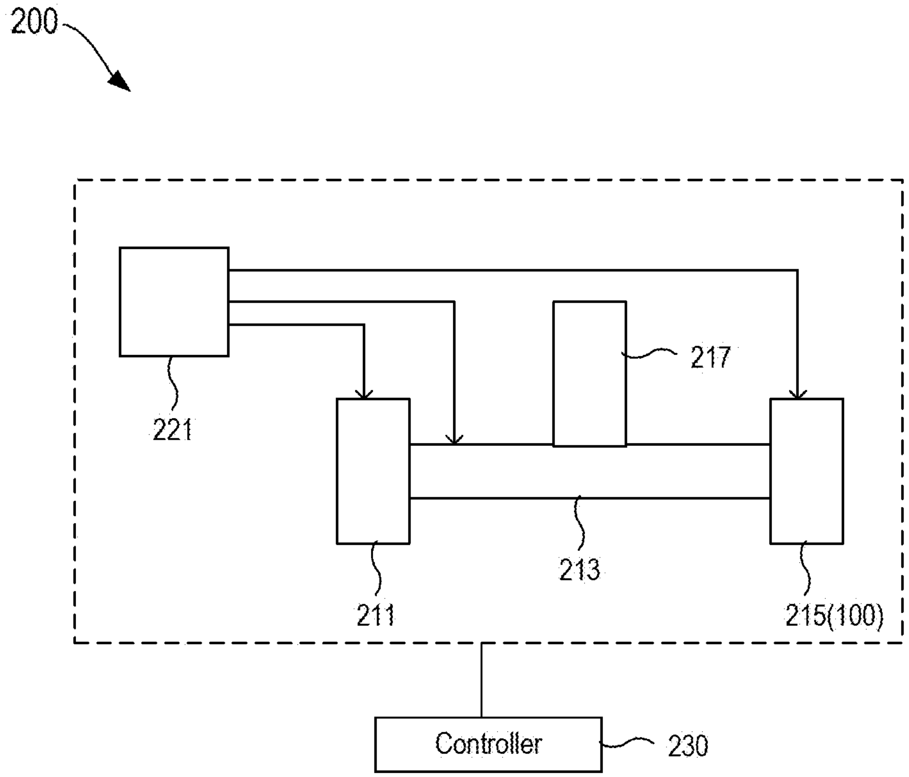
FIG. 2 shows a schematic of a semiconductor tool, in accordance with some embodiments of the present disclosure.

FIG. 2 shows a schematic of a semiconductor tool 200, in accordance with some embodiments of the present disclosure. The semiconductor tool 200 can include a cleaning module 211, a transportation chamber 213, a supercritical chamber 215 and a fluid storage module 221 and (optionally one or more processing modules 217). Note that the supercritical chamber 215 herein can correspond to the processing chamber 100 in FIG. 1. In some embodiments, the cleaning module 211, the transportation chamber 213 and the supercritical chamber 215 (and optionally the one or more processing modules 217) can be integrated on a common platform so that a workpiece in the semiconductor tool 200 is not exposed to an environment outside the common platform. Examples of such common platforms are disclosed in e.g. Applicant's patent publications US2020/0083080A1 and US2023/0326767A1, both of which are incorporated herein by reference in their entirety. Particularly, the one or more processing modules 217 can include a metrology module, a deposition module, a bake module, an imaging module, a development module, an etching module, etc., which are described in detail in e.g. Applicant's patent publications US2020/0083080A1 and US2023/0326767A1. The numbers and the positions of components of the semiconductor tool 200 are not particularly limited.

The semiconductor tool 200 can be used to process the wafer 121 in the cleaning module 211, transport the wafer to the supercritical chamber 215 via the transportation chamber 213. The fluid storage module 221 can be used to provide the first solvent and the second solvent for the cleaning module 211. The first solvent and the second solvent can be premixed to form a mixture and stored in a common container. Alternatively, the first solvent and the second solvent can be stored in separate containers and mixed to form the mixture before entering the cleaning module 211. The fluid storage module 221 can also be used to provide the first solvent and/or the second solvent for the transportation chamber 213. For example, the fluid storage module 221 can supply a vapor of the first solvent and/or a vapor of the second solvent into the transportation chamber 213 while transporting the wafer 121 in order to suppress solvent evaporation. The fluid storage module 221 can further be used to provide the processing fluid 125 for the supercritical chamber 215.

In some embodiments, the cleaning module 211 can include a spin coater. The top surface 121' of the wafer 121 can be cleaned with one or more solvents such as IPA using the spin coater. In a non-limiting example, the wafer 121 can be cleaned by dispensing IPA onto the top surface 121' of the wafer 121 while the wafer 121 is rotating. Then, a solvent mixture of IPA and 3-methoxyperfluoro(2-methylpentane) can be dispensed onto the top surface 121' while keeping rotating the wafer 121. Rotation of the wafer 121 can be terminated so the wafer is stationary. Then, the dispensing of the mixture is terminated so as to form the solvent film 123, before the wafer 121 is transported to the supercritical chamber 215. In other words, the wafer is rotated when the solvent mixture is initially dispensed onto the top surface of the wafer. Then, rotation of the wafer 121 is terminated so the wafer is stationary. Subsequently, the dispensing of the mixture is terminated to form the solvent film 123.

Additionally, before being cleaned in the cleaning module 211, the wafer 121 can go through various processes including, but not limited to, film deposition, etching, photoresist development, baking, doping, etc., which can be executed in the one or more processing modules 217. As a result, the wafer 121 can include various microscopic or nanoscale patterns (not shown) of semiconductors, metals and dielectrics formed on the top surface 121'. Such patterns can have various shapes including, but not limited to, dots, lines, pillars, mesas, trenches, cylinders, etc. Such patterns can form various transistors, wiring structures, contact structures, circuits, etc.

Herein, a solvent mixture of IPA and 3-methoxyperfluoro (2-methylpentane) is used for illustrative purposes, it should be understood that other solvents can be used alternatively or additionally as previously discussed. Furthermore, concentrations of components in the solvent mixture (dispensed onto the wafer 121) can be similar to or the same as concentrations of corresponding components in the solvent film 123 (coating the wafer 121). For example, relative to a total mass of the solvent mixture, the first solvent can have a concentration of 1 wt. % or more and less than 100 wt. % (e.g. 1 wt. %, 5 wt. %, 10 wt. %, 20 wt. %, 30 wt. %, 40 wt. %, 50 wt. %, 60 wt. %, 70 wt. %, 80 wt. %, 90 wt. %, 95 wt. %, 98 wt. %, 99 wt. %, 99.9 wt. % or any values therebetween); the second solvent can have a concentration of 1 wt. % or more and less than 100 wt. % (e.g. 0.1 wt. %, 1 wt. %, 2 wt. %, 5 wt. %, 10 wt. %, 20 wt. %, 30 wt. %, 40 wt. %, 50 wt. %, 60 wt. %, 70 wt. %, 80 wt. %, 90 wt. %, 95 wt. %, 98 wt. %, 99 wt. % or any values therebetween); the first solvent and the second solvent can have a total concentration of 60 wt. % or more and 100 wt. % or less (e.g. 60 wt. %, 70 wt. %, 80 wt. %, 90 wt. %, 95 wt. %, 98 wt. %, 99 wt. %, 99.9 wt. %. 100 wt. % or any values therebetween); and the solvent mixture may include impurities having a total concentration of 0 wt. % or more and 5 wt. % or less, e.g. 0.1 wt. %, 1 wt. %, 2 wt. %, 5 wt. % or any values therebetween.

Optionally, the semiconductor tool 200 can include a controller 230. Components of the semiconductor tool 200 can be connected to and controlled by the controller 230 that may optionally be connected to a corresponding memory storage unit and user interface (all not shown). Various wafer-processing operations can be executed via the user interface, and various wafer processing recipes and operations can be stored in a storage unit. Accordingly, a given wafer can be processed within the semiconductor tool 200 with various microfabrication techniques.

It will be recognized that the controller 230 may be coupled to various components of the semiconductor tool 200 to receive inputs from and provide outputs to the components. For example, the controller 230 can be configured to receive real-time pressure, temperature and concentration data from the supercritical chamber 215 (or from the at least one sensor 131 in the processing chamber) and output commands to adjust the inner pressure and the inner temperature of the processing chamber 100. The controller 230 can also be configured to execute recipes to clean the wafer 121 in the cleaning module 211 and transport the wafer 121. The controller 230 can further be configured to adjust knobs and control settings for the semiconductor tool 200. Of course the adjustments can be manually made as well.

The controller 230 can be implemented in a wide variety of manners. In one example, the controller 230 is a computer. In another example, the controller 230 includes one or more programmable integrated circuits that are programmed to provide the functionality described herein. For example, one or more processors (e.g. microprocessor, microcontroller, central processing unit, etc.), programmable logic devices (e.g. complex programmable logic device (CPLD)), field programmable gate array (FPGA), etc.), and/or other programmable integrated circuits can be programmed with software or other programming instructions to implement the functionality of a plasma process recipe. It is further noted that the software or other programming instructions can be stored in one or more non-transitory computer-readable mediums (e.g. memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Figure 7:
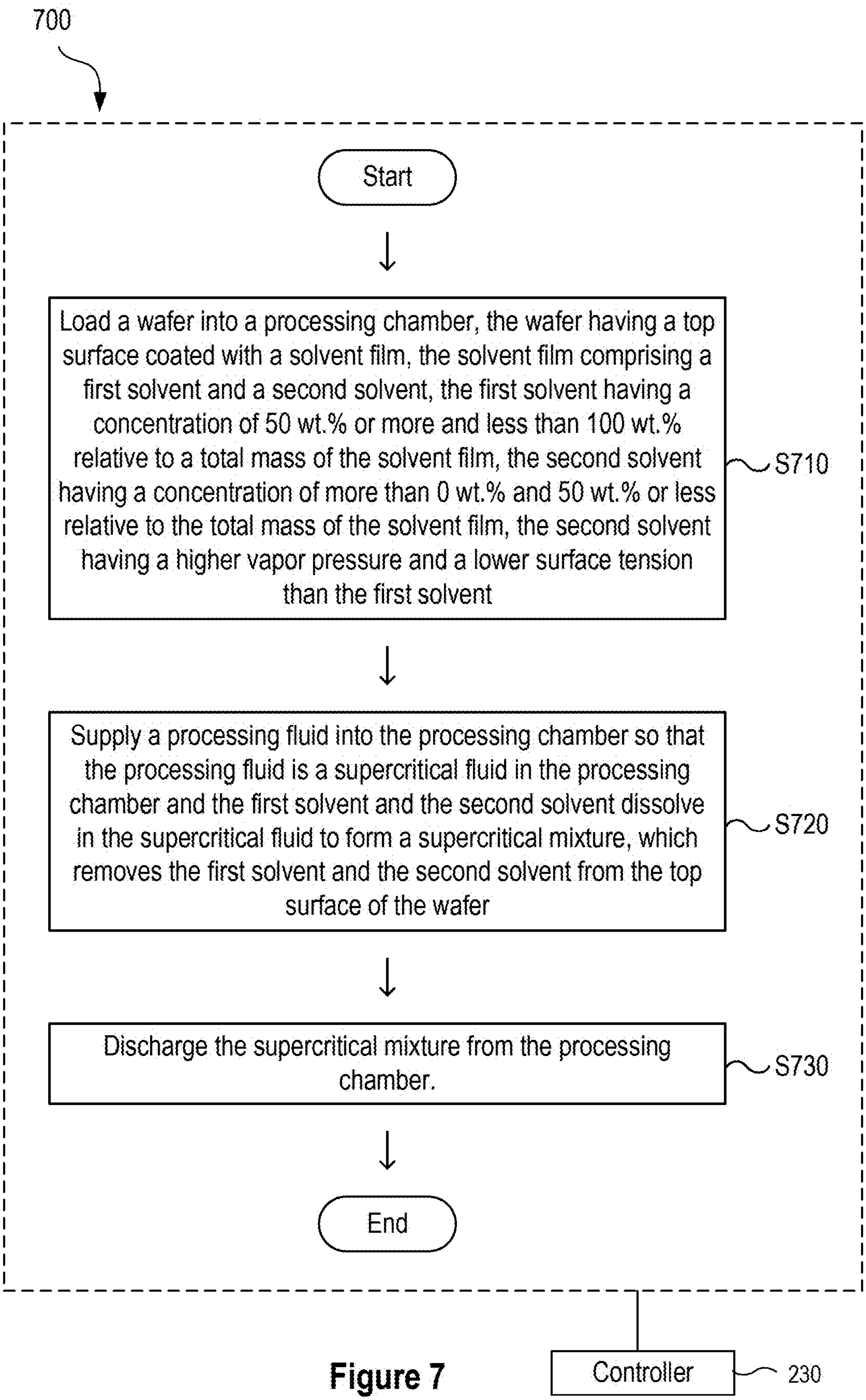
FIG. 7 shows a flow chart of a process for manufacturing a semiconductor device, in accordance with some embodiments of the present disclosure.

FIG. 7 shows a flow chart of a process 700 for wafer processing, in accordance with some embodiments of the present disclosure. At step S710, a wafer is loaded into a processing chamber. The wafer has a top surface coated with a solvent film. The solvent film includes a first solvent and a second solvent. The first solvent has a concentration of 50 wt. % or more and less than 100 wt. % relative to a total mass of the solvent film. The second solvent has a concentration of more than 0 wt. % and 50 wt. % or less relative to the total mass of the solvent film. The second solvent has a higher vapor pressure and a lower surface tension than the first solvent. At step S720, a processing fluid is supplied into the processing chamber so that the processing fluid is a supercritical fluid in the processing chamber and the first solvent and the second solvent dissolve in the supercritical fluid to form a supercritical mixture, which removes the first solvent and the second solvent from the top surface of the wafer. At step S730, the supercritical mixture is discharged from the processing chamber.

Additionally, the controller 230 may be coupled to various components of the process 700 to receive inputs from and provide outputs to the components. For example, the controller 230 can be configured to execute steps S710, S720 and S730. Of course, one or more functions of the controller 230 can also be manually accomplished.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details.

Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of wafer processing, the method comprising:

loading a wafer into a processing chamber, the wafer having a top surface coated with a solvent film, the solvent film comprising a first solvent and a second solvent, the first solvent having a concentration of 50 wt. % or more and less than 100 wt. % relative to a total mass of the solvent film, the second solvent having a concentration of more than 0 wt. % and 50 wt. % or less relative to the total mass of the solvent film, the second solvent having a higher vapor pressure and a lower surface tension than the first solvent;

supplying a processing fluid into the processing chamber so that the processing fluid is a supercritical fluid in the processing chamber and the first solvent and the second solvent dissolve in the supercritical fluid to form a supercritical mixture, which removes the first solvent and the second solvent from the top surface of the wafer; and discharging the supercritical mixture from the processing chamber.

2. The method of claim 1, wherein:

the first solvent comprises a non-fluorinated organic solvent having 1 to 6 carbon atoms, at least one oxygen atom and no fluorine atom, and the second solvent comprises a fluorinated organic solvent having 3 to 16 carbon atoms, at least one fluorine atom and at least one oxygen or nitrogen atom.

3. The method of claim 1, wherein the supplying and the discharging comprise:

introducing the processing fluid into the processing chamber until an inner pressure of the processing chamber reaches a first pressure so that a portion of the first solvent and a portion of the second solvent dissolve in the supercritical fluid to form the supercritical mixture, which reduces a mass of the solvent film on the top surface of the wafer; and reducing the inner pressure from the first pressure to a second pressure to remove a portion of the supercritical mixture from the processing chamber.

4. The method of claim 1, wherein the supplying and the discharging comprise:

introducing the processing fluid into the processing chamber at a constant flow rate to form the supercritical mixture; and discharging the supercritical mixture out of the processing chamber at the constant flow rate while the processing fluid is introduced into the processing chamber.

5. The method of claim 1, prior to the loading, the method further comprising:

dispensing a solvent mixture comprising the first solvent and the second solvent onto the top surface of the wafer.

6. The method of claim 1, wherein:

an inner temperature of the processing chamber is from Tc to Tc+20° C., and

Tc is a supercritical temperature of the processing fluid.

7. The method of claim 1, wherein:

the processing fluid comprises carbon dioxide.

8. The method of claim 1, wherein:

the first solvent has a concentration of 80 wt. % or more and 99 wt. % or less relative to the total mass of the solvent film, and the second solvent has a concentration of 1 wt. % or more and 20 wt. % or less relative to the total mass of the solvent film.

9. The method of claim 1, wherein:

the first solvent and the second solvent have a total concentration of 90 wt. % or more and 100 wt. % or less relative to the total mass of the solvent film.

10. The method of claim 1, prior to the loading, the method further comprising:

dispensing a mixture of the first solvent and the second solvent onto the wafer to form the solvent film in a prior chamber; and transporting the wafer from the prior chamber via a transportation chamber to the processing chamber.

11. The method of claim 2, wherein:

the first solvent has 1 to 6 carbon atoms, 1 to 2 oxygen atoms and no fluorine atom and includes at least one selected from the group consisting of an alcohol and a ketone, and the second solvent has 3 to 10 carbon atoms, 6 to 22 fluorine atoms and 1 oxygen atom and includes at least one selected from the group consisting of an alcohol and an ether.

12. The method of claim 3, wherein the supplying and the discharging further comprise:

alternately repeating the introducing and the reducing, wherein the first pressure is above a supercritical pressure of the processing fluid, and the second pressure is at or above the supercritical pressure of the processing fluid.

13. The method of claim 5, further comprising:

rotating the wafer when the solvent mixture is initially dispensed onto the top surface of the wafer.

14. The method of claim 5, prior to the dispensing, the method further comprising:

executing at least one process selected from the group consisting of film deposition, etching, photoresist development, baking and doping.

15. The method of claim 10, further comprising:

supplying a vapor of the first solvent into the transportation chamber during the transporting.

16. The method of claim 10, wherein:

the prior chamber comprises a spin coater.

17. The method of claim 11, wherein:

the first solvent includes at least one selected from the group consisting of methanol, ethanol, 1-propanol, isopropyl alcohol, t-butyl alcohol, acetone and ethyl methyl ketone, and the second solvent includes at least one selected from the group consisting of 3-methoxyperfluoro(2-methylpentane), 1,1,1,2,2,3,4,5,5,5-decafluoro-3-methoxy-4-(trifluoromethyl)-pentane, 1H, 1H-perfluoro-1-heptanol, 3,3,4,4,4-pentafluoro-2-pentafluoroethyl-2-trifluoromethylbutanol, 1,1,2,3,3,3-hexafluoropropyl 1H,1H-heptafluorobutyl ether, 1,1,1,3,3,3-hexafluoro-2-propanol, 1H, 1H,2H,2H-perfluorohexan-1-ol, 1-ethoxy-1,1,2,2,3,3,4,4,4-nonafluorobutane, 2-(ethoxydifluoromethyl)-1,1,1,2,3,3,3-heptafluoro propane and 3-(nonafluoro-tert-butyl) propan-1-ol.

18. The method of claim 13, further comprising:

terminating the rotating; and then terminating the dispensing to form the solvent film.

19. The method of claim 15, wherein:

the prior chamber, the transportation chamber and the processing chamber are integrated on a common platform so that the solvent film is not exposed to an environment outside the common platform.

20. The method of claim 17, wherein:

the first solvent comprises isopropyl alcohol, and the second solvent comprises 3-methoxyperfluoro(2-methylpentane).

* * * * *